(12) United States Patent
Niroomand et al.

(10) Patent No.: US 8,039,399 B2
(45) Date of Patent: Oct. 18, 2011

(54) METHODS OF FORMING PATTERNS UTILIZING LITHOGRAPHY AND SPACERS

(75) Inventors: Ardavan Niroomand, Huldenberg (BE); Gurtej S. Sandhu, Boise, ID (US); Mark Kiehlbauch, Boise, ID (US); Scott Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 486 days.

(21) Appl. No.: 12/248,283

(22) Filed: Oct. 9, 2008

(65) Prior Publication Data

US 2010/0093175 A1 Apr. 15, 2010

(51) Int. Cl.
*H01L 21/311* (2006.01)

(52) U.S. Cl. ............ 438/694; 430/313; 257/E21.249

(58) Field of Classification Search ............ 438/694; 430/313
See application file for complete search history.

(56) References Cited

U.S. PATENT DOCUMENTS

| | | | |
|---|---|---|---|
| 5,372,916 A | 12/1994 | Ogawa et al. | |
| 6,249,335 B1 | 6/2001 | Hirukawa et al. | |
| 6,383,952 B1 | 5/2002 | Subramanian et al. | |
| 6,548,401 B1 | 4/2003 | Trivedi | |
| 6,599,844 B2 | 7/2003 | Koh et al. | |
| 6,627,524 B2 | 9/2003 | Scott | |
| 6,703,323 B2 | 3/2004 | Kong et al. | |
| 6,756,619 B2 | 6/2004 | Tran | |
| 6,872,512 B2 | 3/2005 | Yamashita | |
| 6,905,975 B2 | 6/2005 | Boettiger et al. | |
| 7,166,533 B2 | 1/2007 | Happ | |
| 7,183,142 B2 * | 2/2007 | Anderson et al. | 438/142 |
| 2005/0130068 A1 | 6/2005 | Kondoh et al. | |
| 2005/0255696 A1 | 11/2005 | Makiyama et al. | |
| 2006/0118785 A1 | 6/2006 | Allen et al. | |
| 2006/0154182 A1 | 7/2006 | Brodsky | |
| 2006/0234138 A1 * | 10/2006 | Fehlhaber et al. | 430/5 |
| 2006/0286795 A1 | 12/2006 | Yosho | |
| 2007/0003878 A1 | 1/2007 | Paxton et al. | |
| 2007/0197014 A1 | 8/2007 | Jeon et al. | |
| 2007/0224537 A1 | 9/2007 | Nozaki et al. | |

(Continued)

FOREIGN PATENT DOCUMENTS

EP 0171111 A3 2/1986

(Continued)

OTHER PUBLICATIONS

Pease, R. Fabian, et al. "Lithography and Other Patterning Techniques for Future Electronics" Proceedings of the IEEE/vol. 96, No. 2, Feb. 2008. pp. 248-270.

(Continued)

*Primary Examiner* — Duy Deo
*Assistant Examiner* — Mahmoud Dahimene
(74) *Attorney, Agent, or Firm* — Wells St. John P.S.

(57) ABSTRACT

Some embodiments include methods of forming patterns. A first set of features is photolithographically formed over a substrate, and then a second set of features is photolithographically formed over the substrate. At least some of the features of said second set alternate with features of the first set. Spacer material is formed over and between the features of the first and second sets. The spacer material is anisotropically etched to form spacers along the features of the first and second sets. The features of the first and second sets are then removed to leave a pattern of the spacers over the substrate.

28 Claims, 9 Drawing Sheets

U.S. PATENT DOCUMENTS

| | | |
|---|---|---|
| 2007/0248916 A1 | 10/2007 | Kamijima |
| 2008/0008969 A1* | 1/2008 | Zhou et al. .................... 430/313 |
| 2008/0032243 A1 | 2/2008 | Jung |
| 2008/0032508 A1 | 2/2008 | Chang |
| 2008/0153287 A1 | 6/2008 | Jeong |
| 2008/0220600 A1 | 9/2008 | Alapati et al. |
| 2009/0246706 A1* | 10/2009 | Hendel et al. ................. 430/314 |

FOREIGN PATENT DOCUMENTS

| | | |
|---|---|---|
| JP | 56045631 | 4/1981 |
| JP | 58157135 | 9/1983 |
| JP | 59211231 | 11/1984 |
| JP | 2003234279 | 8/2003 |
| JP | 2004247399 | 9/2004 |
| KR | 20030049198 | 6/2003 |
| KR | 20030056601 | 7/2003 |
| KR | 20030089063 | 11/2003 |
| KR | 20040057582 | 7/2004 |
| KR | 1020080020186 A | 3/2008 |
| WO | PCT/US2009/056496 | 3/2010 |

OTHER PUBLICATIONS

Fritze, Michael, et al. "Enhanced Resolution for Future Fabrication" IEEE Circuits & Devices Magazine, Jan. 2003, pp. 43-47.

Owa, Soichi, et al. "immersion Lithography Ready for 45 nm Manufacturing and Beyond" 2007 IEEE/SEMI Advanced Semiconductor Manufacturing Conference, pp. 238-244.

Liau, C.Y., et al. "Softbake and Post-exposure Bake Optimization for Process Window Improvement and Optical Proximity Effect Tuning" ICSE 2006 Proc. 2006, Kuala Lumpur, Malaysia, 7 pages.

Tan, Hua, et al. "Current Status of Nanonex Nanoimprint Solutions" website: www.nanonex.com/technology.htm, 2004, 9 pages.

Ma, W. H-L. "Plasma Resist Image Stabilization Technique (PRIST)" IEEE, 1980, vol. 26, pp. 574-575.

Hori, Masafumi, et al., "Sub-40nm Half-Pitch Double Patterning with Resist Freezing Process" Proc. of SPIE, vol. 6923, (2008), pp. 69230H-1-69230H8.

Lee, Doo-Youl, et al. "Double-Patterning Technique Using Plasma Treatment of Photoresist" Japanese Journal of Applied Physics, vol. 46, No. 9B, 2007, pp. 6135-6139.

\* cited by examiner

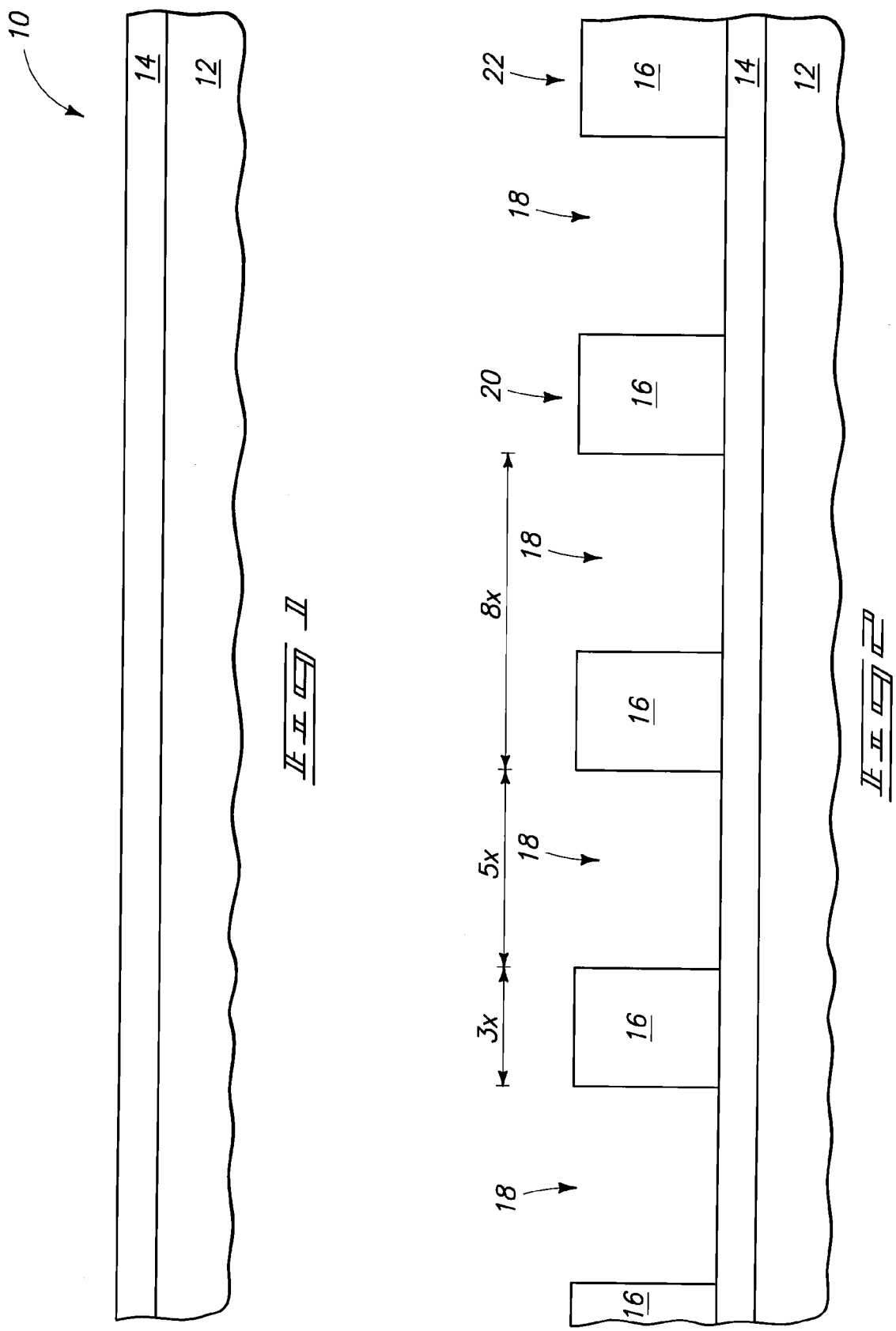

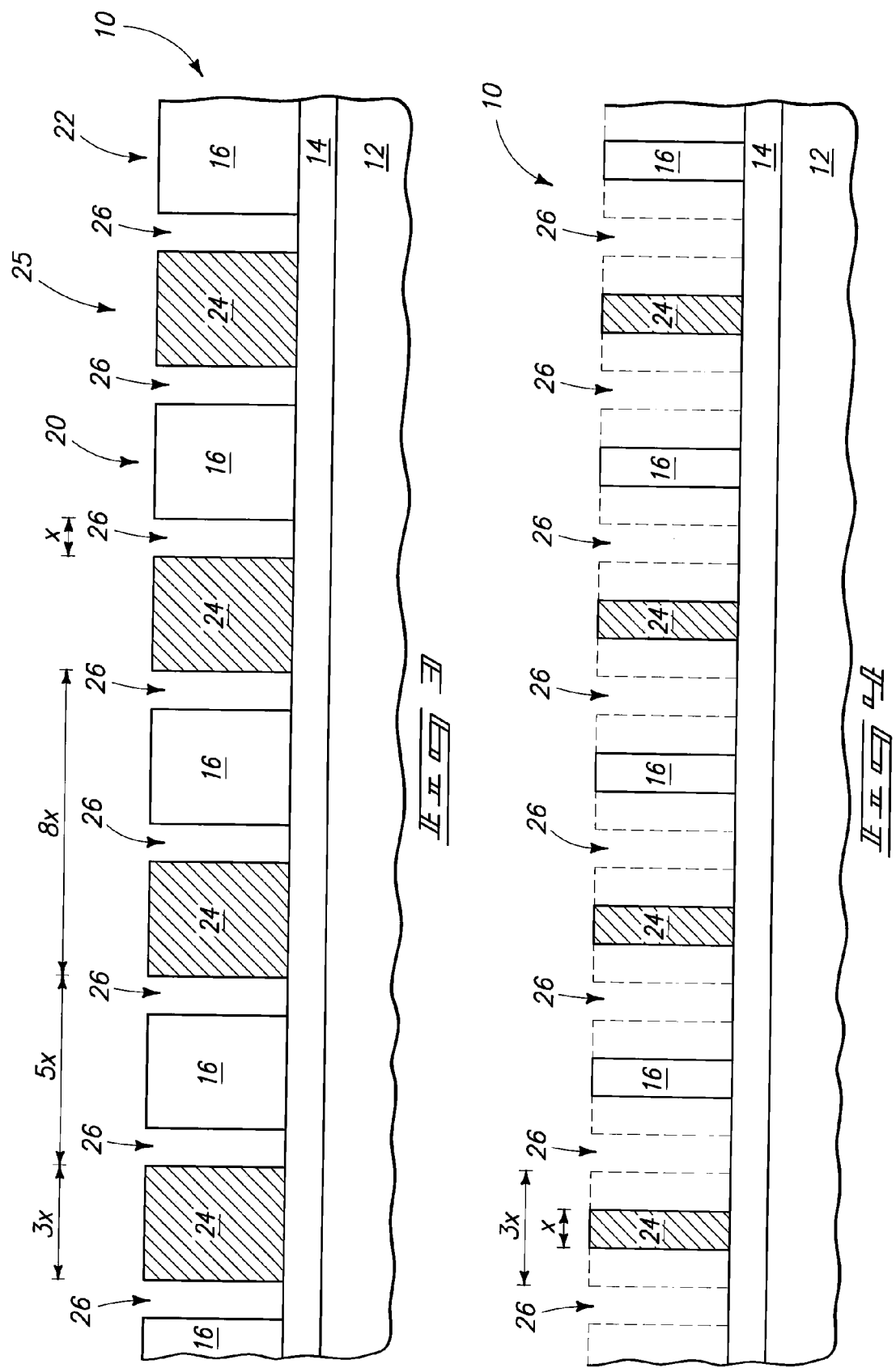

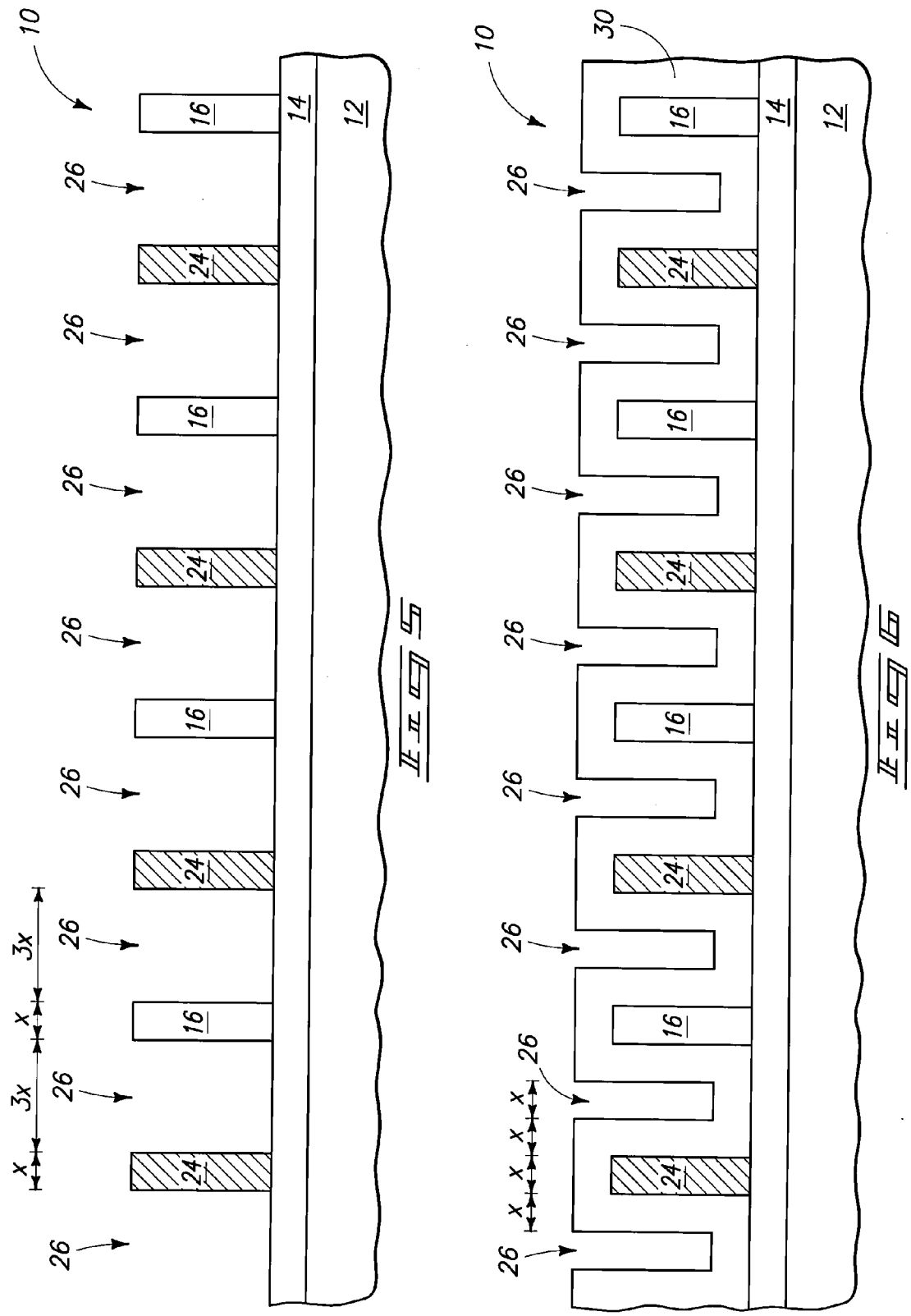

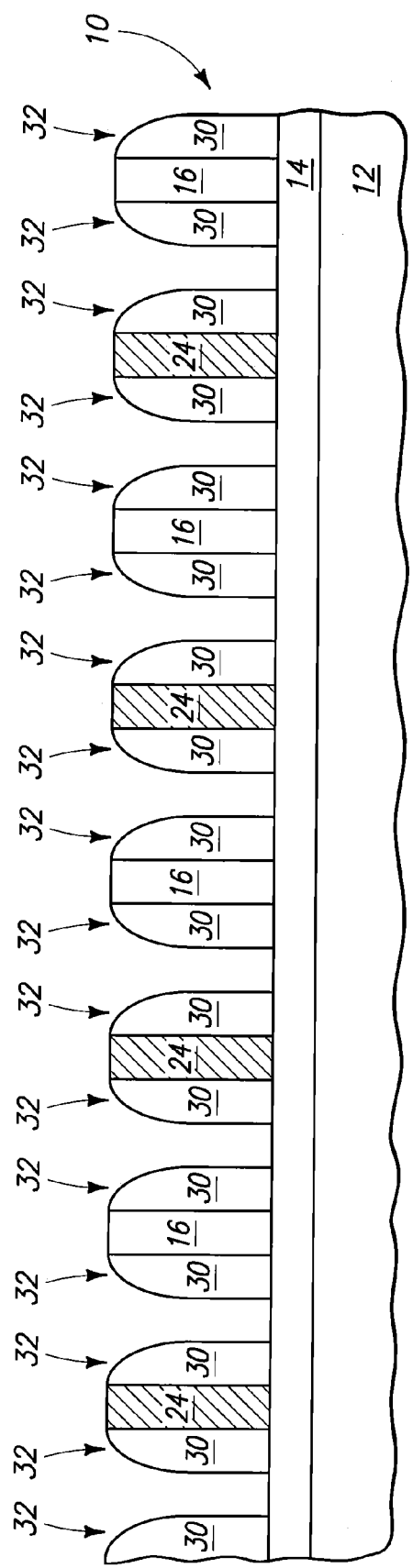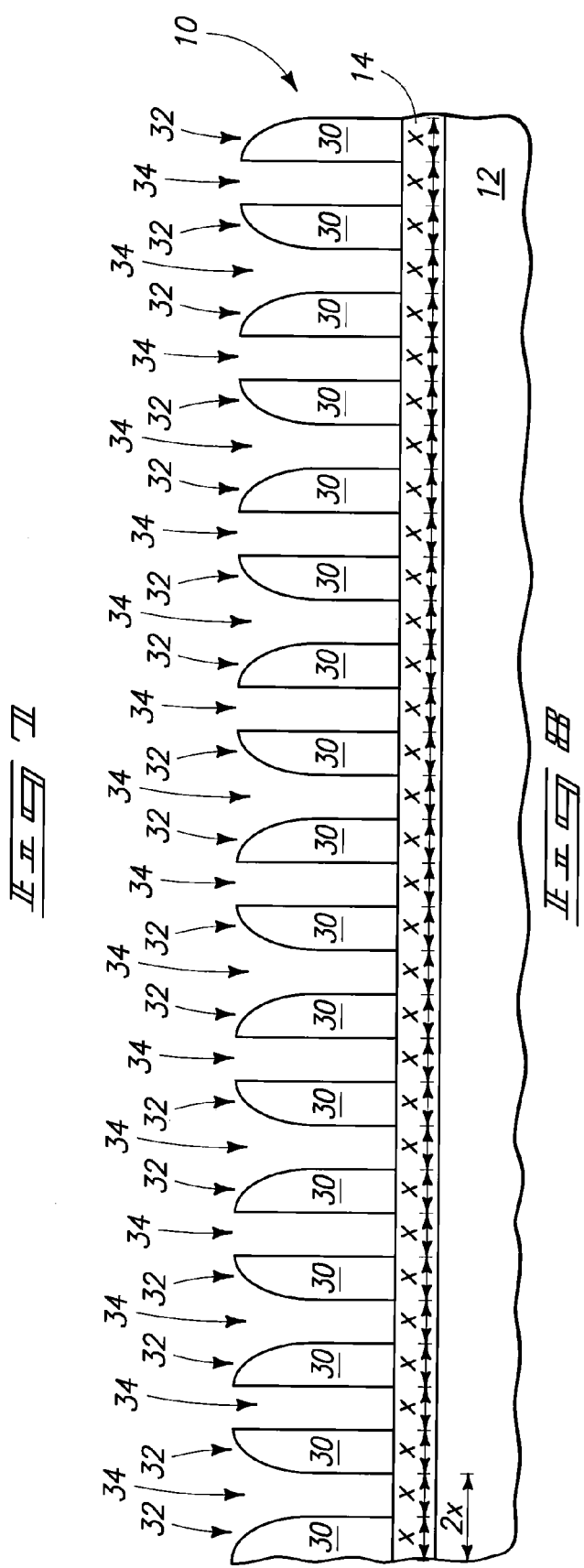

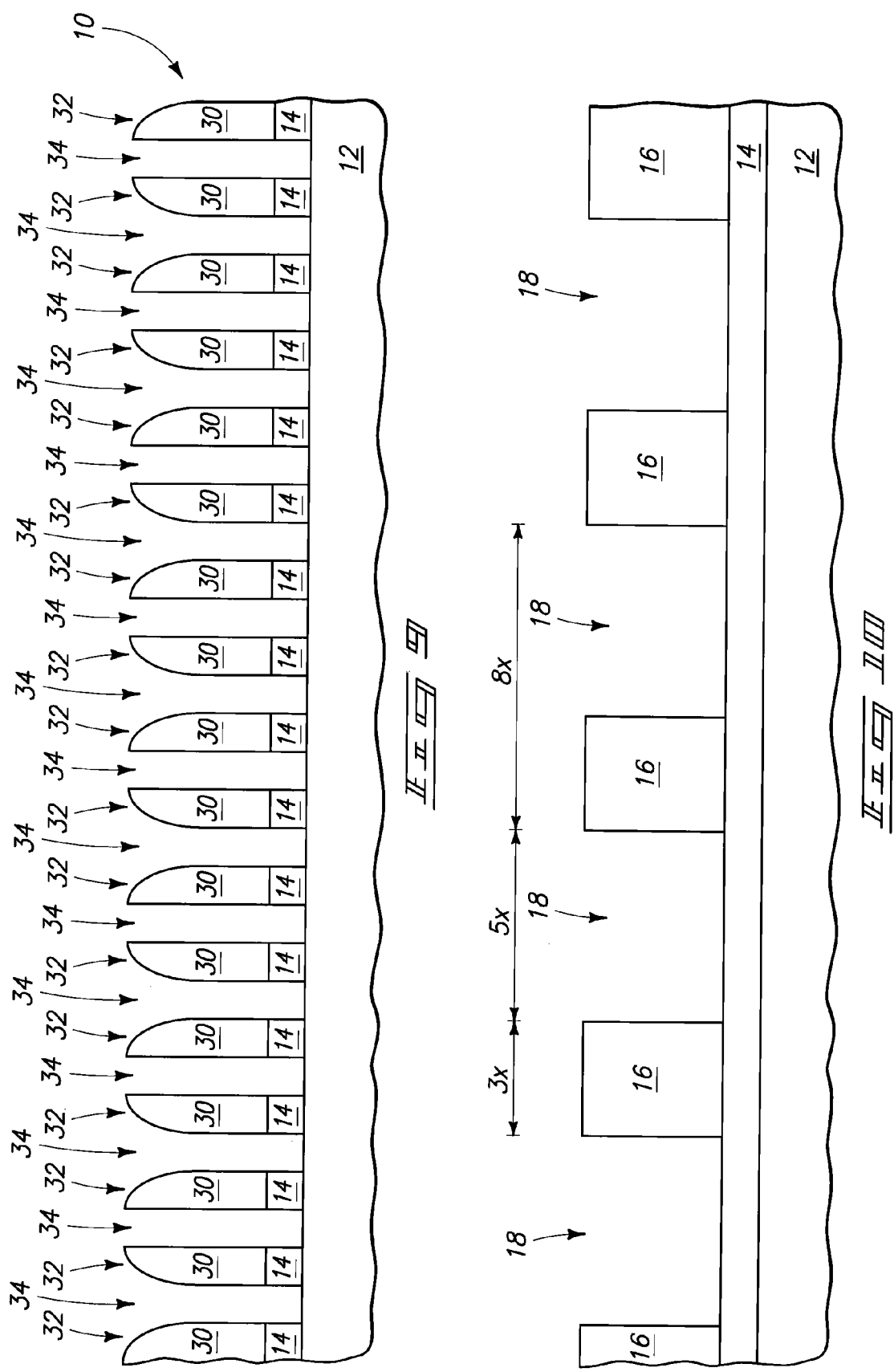

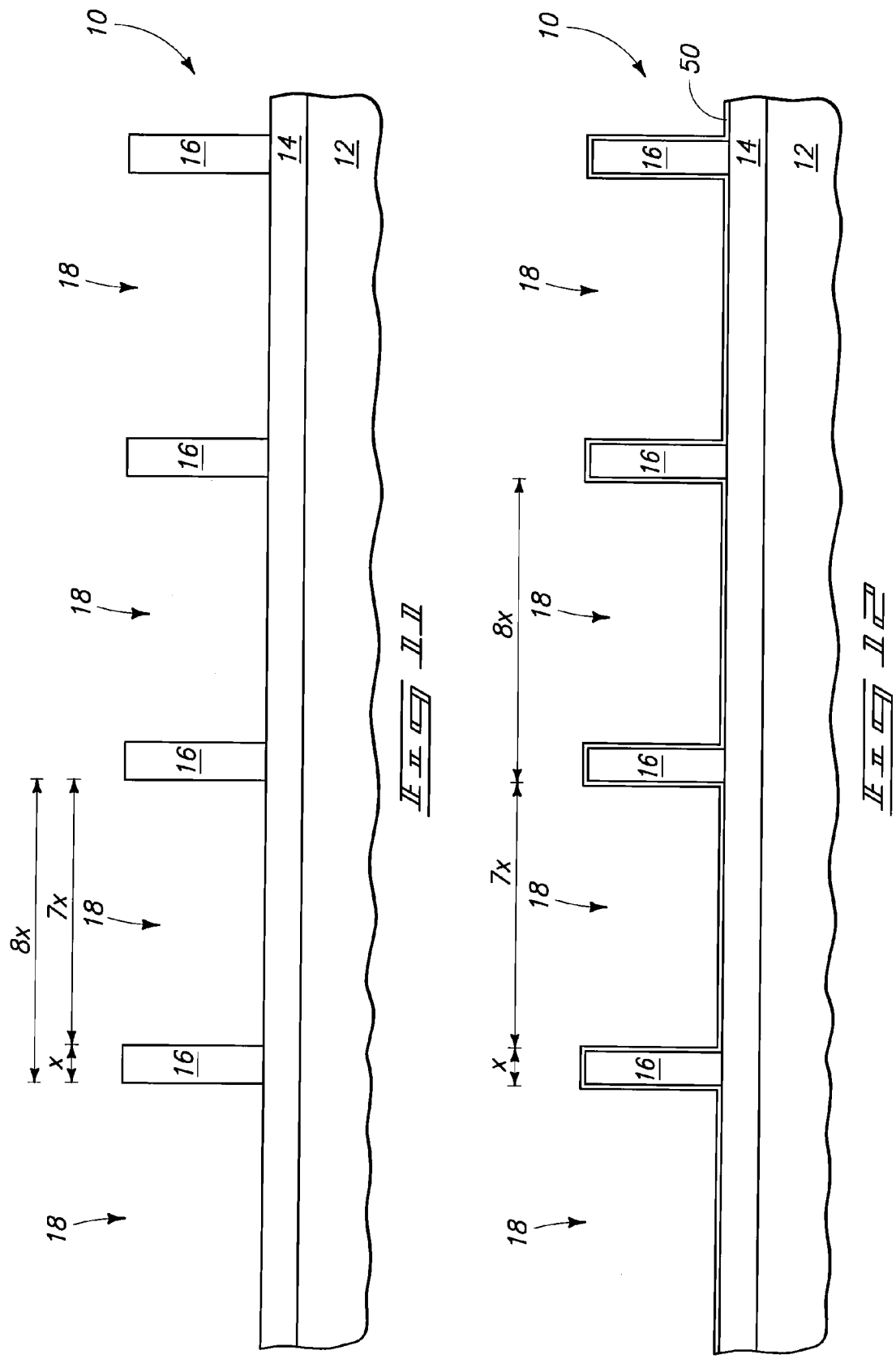

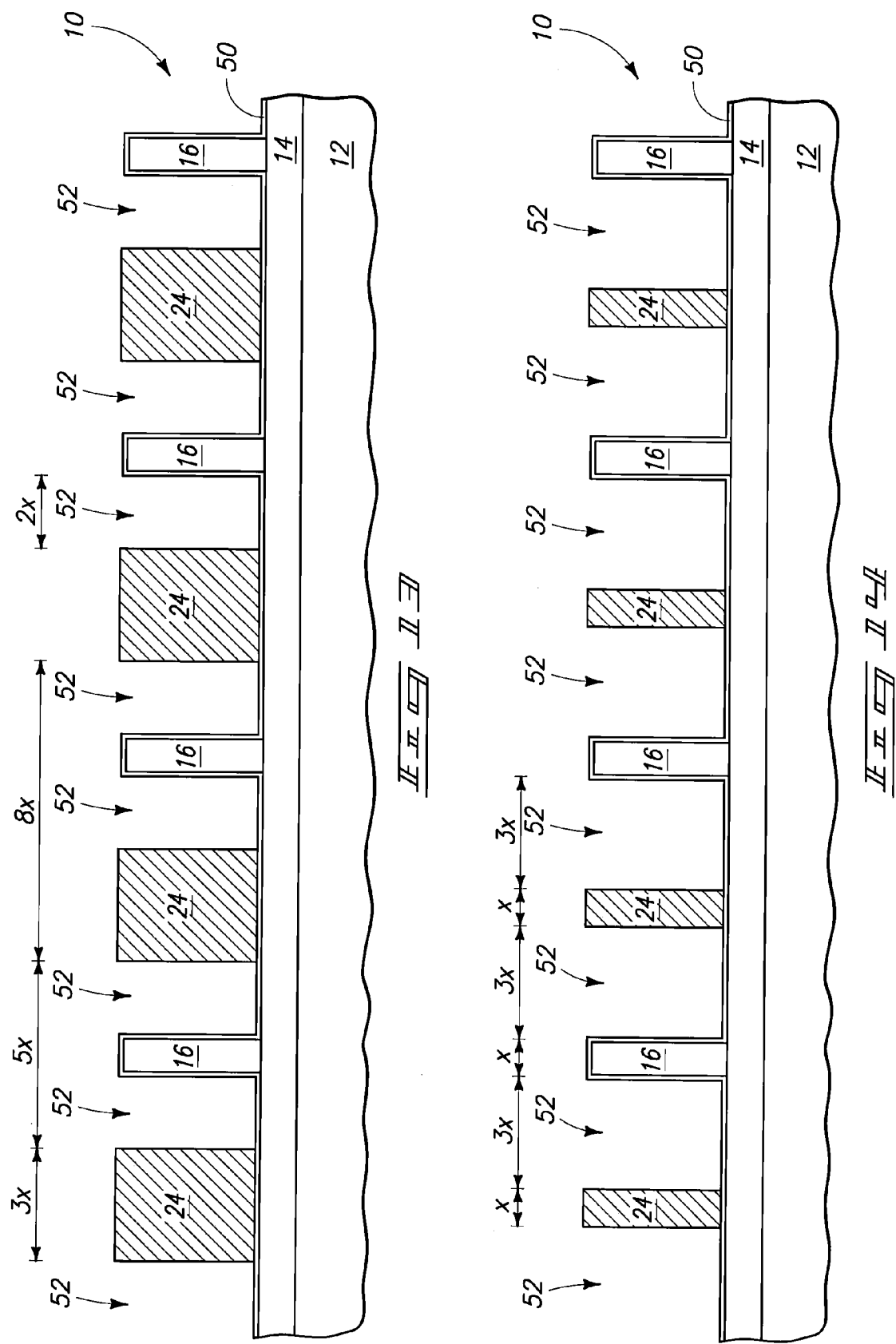

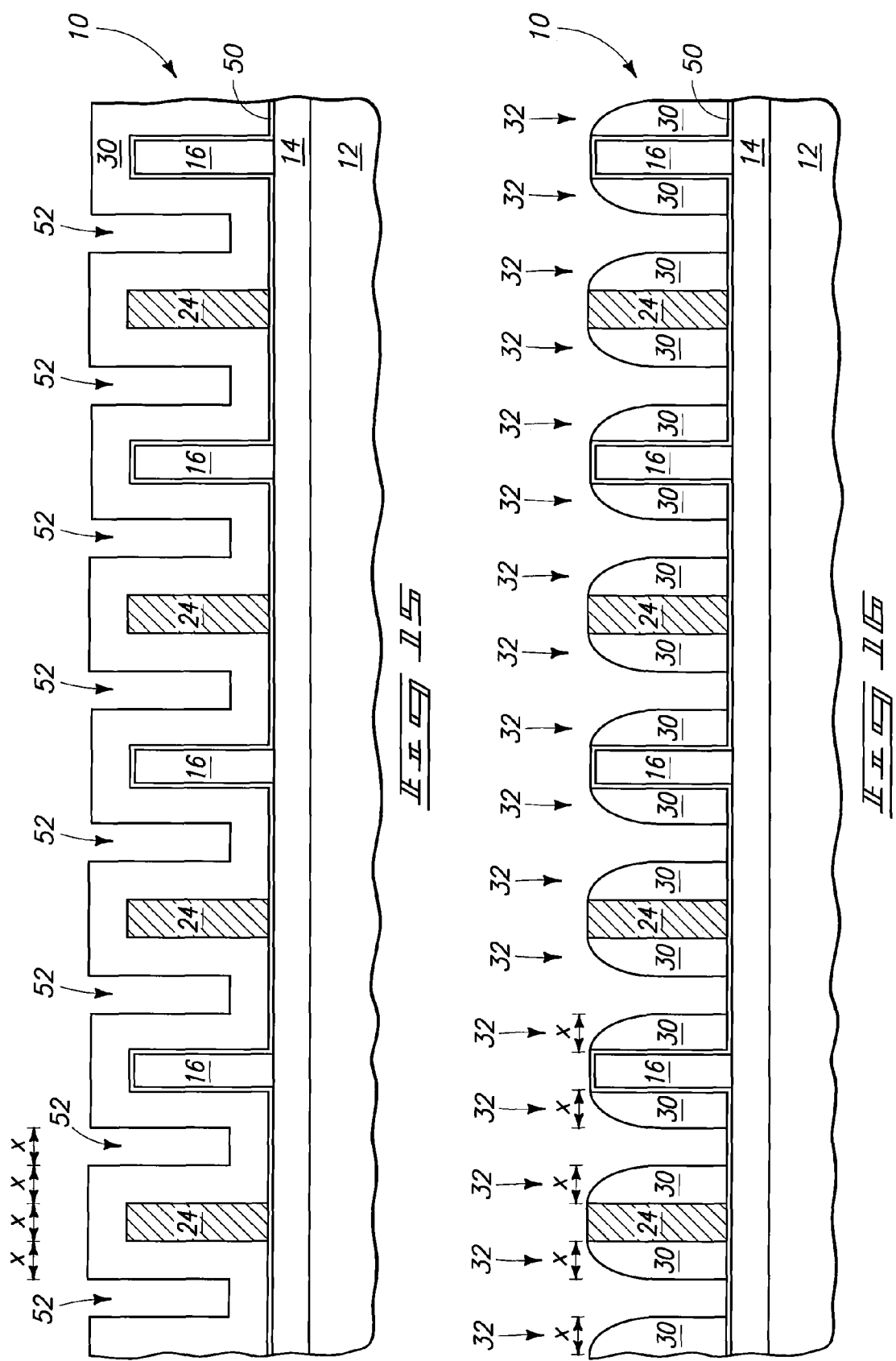

METHODS OF FORMING PATTERNS UTILIZING LITHOGRAPHY AND SPACERS

TECHNICAL FIELD

Methods of forming patterns utilizing lithography and spacers.

BACKGROUND

Numerous applications exist in which it is desired to form repeating patterns having a very short pitch. For instance, integrated circuit fabrication may involve formation of a repeating pattern of memory-storage units (i.e., NAND unit cells, dynamic random access [DRAM] unit cells, cross-point memory unit cells, etc.).

Integrated circuit fabrication may involve formation of a patterned mask over a semiconductor substrate, followed by transfer of a pattern from the mask into the substrate with one or more etches. The pattern imparted into the substrate may be utilized to form individual components of integrated circuitry.

A continuing goal of integrated circuit fabrication is to increase integrated circuit density, and accordingly to decrease the size of individual integrated circuit components. There is thus a continuing goal to form patterned masks having increasing densities of individual features. In cases in which the patterned masks comprise repeating patterns of features, there is a continuing goal to form the repeating patterns to higher density, or in other words to decreasing pitch.

It would be desired to develop new methods of forming patterns which enable repeating patterns to be formed to high density.

BRIEF DESCRIPTION OF THE DRAWINGS

FIGS. 1-9 are diagrammatic, cross-sectional views of a portion of a semiconductor wafer construction shown at various process stages of an example embodiment.

FIGS. 10-17 are diagrammatic, cross-sectional views of a portion of a semiconductor wafer construction shown at various process stages of another example embodiment.

DETAILED DESCRIPTION OF THE ILLUSTRATED EMBODIMENTS

Figure 11:
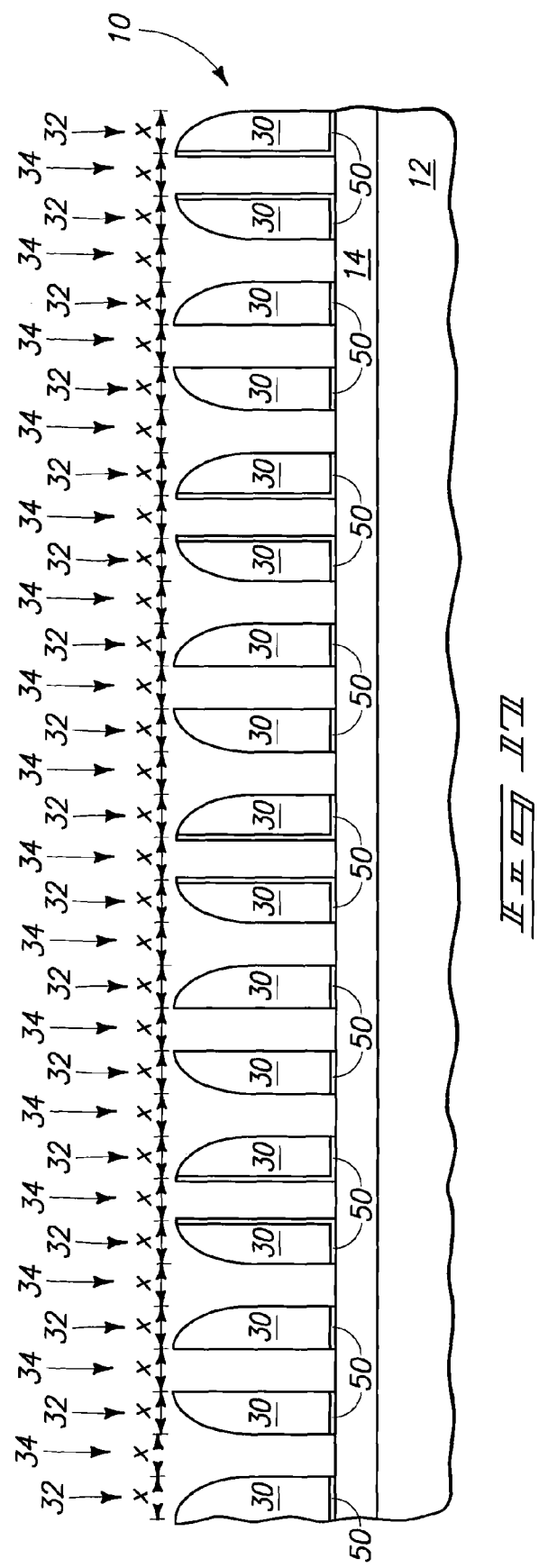

Some embodiments include methods in which a repeating pattern is formed utilizing two discrete lithographic steps. Each of the lithographic steps has a minimum feature size that can be obtained utilizing the particular lithographic technology of the step. For instance, if a lithographic step is photolithographic, the minimum feature size may be dictated by a wavelength utilized during the photolithography.

The utilization of two discrete lithographic steps enables a repeating pattern to be formed to a pitch less than the pitch achievable by either lithographic step utilized alone. The pitch of the repeating pattern may be further reduced by utilization of spacers provided adjacent the lithographically-formed features.

Example embodiments are described with reference to FIGS. 1-17.

Referring to FIG. 1, such illustrates a portion of a semiconductor construction 10. Semiconductor construction 10 comprises a base 12 and a material 14 over the base.

Base 12 may correspond to a semiconductor wafer, such as, for example, a monocrystalline silicon wafer.

Material 14 represents a material which is to be patterned to form integrated circuitry. Material 14 may be an electrically insulative material (for instance, may comprise one or more of silicon nitride, silicon dioxide, etc.), an electrically conductive material (for instance, may comprise one or more of various metals, metal-containing compositions, conductively-doped semiconductor material, etc.) or a semiconductive material (for instance, silicon, germanium, etc.). Although only the single material 14 is shown supported by base 12, in some embodiments multiple materials may be supported by the base at the processing stage of FIG. 1. For instance, if it is desired to form NAND unit cells over base 12, there may be a plurality of gate materials stacked over base 12; with such gate materials ultimately being simultaneously patterned to form a plurality of gate constructions supported by base 12. As another example, if it is desired to form cross-point memory, there may be a plurality of materials stacked over base 12; with such materials ultimately being simultaneously patterned to form a plurality of lines extending across base 12. As yet another example, if it is desired to form DRAM, there may be a plurality of materials stacked over base 12; with such materials ultimately being simultaneously patterned to form a plurality of wordlines and/or bitlines extending across base 12.

In some embodiments, material 14 may be omitted, and a masking pattern (discussed below with reference to FIG. 8) may be formed directly on the semiconductor material of base 12. The masking pattern may then be utilized to define locations of openings that are subsequently etched into base 12.

Base 12 and material 14 may be together referred to as a semiconductor substrate. The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Referring to FIG. 2, a first set of masking features 16 are lithographically formed over material 14. The first set of masking features may, for example, comprise photoresist, and may be formed by photolithographic processing. Specifically, a layer of photoresist may be formed over material 14, and then exposed to actinic radiation and appropriate developer to leave the illustrated pattern of features 16. Alternatively, masking features 16 may be formed by other lithographic methods, such as, for example, imprint lithography. The masking features 16 may be referred to as first masking features to distinguish them from other masking features formed in subsequent processing.

Each of the individual masking features 16 comprises a width of about 3x, where "x" is a dimension that will ultimately be imparted to a repeating pattern of structures formed from features 16 (with such structures being shown and described with reference to FIG. 8). The masking features may be formed so that the width 3x corresponds to a minimum width achievable with the lithography method utilized to form the masking features, and in some embodiments such width may be from about 30 nanometers to about 60 nanometers.

Masking features 16 are spaced from one another by gaps 18. Such gaps may be referred to as first gaps, to distinguish them from other gaps that are subsequently formed. The first gaps have widths of about 5x.

The masking features 16 form a repeating pattern across material 14. Such repeating pattern has a pitch corresponding to the distance across a masking feature and the adjacent gap, which in the shown embodiment is about 8x.

Two of the masking features of FIG. 2 are designated as features 20 and 22, respectively. Such masking features represent a pair of features which are adjacent to one another.

The masking features 16 may be treated to render them insoluble in solvent utilized during subsequent deposition of photoresist over features 16. Such treatment may comprise, for example, formation of a thin layer of protective material (not shown) along exposed surfaces of masking features 16, inducement of a chemical change (such as chemical cross-linking) throughout the masking features, and/or inducement of a chemical change along the exposed outer surfaces of the masking features (such as through exposure to halogen in a plasma). The term "solvent casting" is utilized to describe the problematic solvation of patterned photoresist features in a solvent utilized for deposition of additional photoresist over the features. Accordingly, the treatment of features 16 may be referred to as a treatment which renders the features resistant to solvent casting.

Referring to FIG. 3, a second set of masking features 24 is lithographically formed over material 14. The masking features 24 may correspond to photoresist features, and may be formed into the shown pattern utilizing photolithographic processing, after features 16 have been treated to render them resistant to solvent casting.

The second masking features 24 are shown with cross-hatching in FIG. 3 to aid the reader in distinguishing the second masking features from the first masking features. The cross-hatching of the second masking features, and lack of cross-hatching of the first masking features, does not indicate a difference in materials utilized between the first and second masking features; and the first and second masking features may be the same composition as one another in some embodiments, and of differing compositions in other embodiments.

The second masking features 24 alternate with the first masking features 16 in the cross-section of FIG. 3. Although all of the illustrated second masking features are shown alternating with first masking features, in other embodiments there may be some second masking features formed which do not alternate with the first masking features.

The individual second masking features 24 comprise a width of about 3x, and are spaced from one another by distances of about 5x. Thus, in the shown embodiment, the second masking features—like the first masking features—are formed at a pitch of about 8x. Each of the second masking features 24 is shown to be approximately centrally located within a gap 18 (FIG. 2) between adjacent first masking features 16. For instance, one of the second masking features is designated by the label 25, and is approximately centrally located in the gap between the adjacent the first masking features 20 and 22.

The second masking features are spaced from adjacent first masking features by intervening spaces that have widths of about x. In some embodiments, the first and second masking features may be together considered to be a plurality of discrete features that are separated from one another by the intervening spaces 26.

Referring to FIGS. 4 and 5, masking features 16 and 24 are subjected to lateral trimming to reduce the lateral thicknesses of the masking features from about 3x to about x. The lateral trimming is diagrammatically illustrated in FIG. 4 by showing dashed-line regions that are ultimately to be removed from the masking features, and FIG. 5 shows the masking features after completion of the lateral trimming. The trimmed masking features of FIG. 5 have widths of x, and are spaced from one another by distances of 3x. In other words, the lateral trimming has increased the size of intervening spaces 26 from x to 3x.

Although the lateral trimming is shown reducing the widths of the masking features 16 and 24 by about two-thirds, in other embodiments the lateral trimming may reduce the widths by other amounts (such as, for example, from about two-thirds to about three-quarters). In some embodiments, the lateral trimming may reduce the widths of masking features 16 and 24 by from about 10 percent to about 80 percent.

In the shown embodiment, the lateral trimming only reduces the lateral widths of the masking features, and does not reduce the heights of the masking features. Such may be an idealized embodiment, and in other embodiments the heights of the masking features may be affected by the lateral trimming so that the heights are somewhat reduced. Also, the lateral trimming may alter the shapes of the masking features, so that the masking features end up somewhat dome-shaped after the lateral trimming.

The lateral trimming may be accomplished by any suitable process. In some embodiments, the masking features consist of photoresist, and the lateral trimming utilizes an $O_2$-based plasma with one or more passivation additives (e.g., $CH_2F_2$).

Referring to FIG. 6, spacer material 30 is formed over and between the masking features 16 and 24. Spacer material 30 is formed to a thickness of about x, and accordingly the spacer material partially fills the intervening spaces 26. Specifically, the spacer material 30 forms a layer of about thickness x along exposed surfaces of masking features 16 and 24, and leaves a gap of about width x within the intervening spaces 26.

Spacer material 30 may be formed by any suitable process, including, for example, one or more of spin-on methodologies, atomic layer deposition (ALD) and chemical vapor deposition (CVD). Spacer material 30 is of a composition different from the composition of masking features 16 and 24 so that the masking features may be selectively removed relative to the spacer material in subsequent processing. In some embodiments the spacer material may comprise, consist essentially of, or consist of an oxide, such as, for example, silicon dioxide.

Referring to FIG. 7, the spacer material 30 is anisotropically etched to form a plurality of discrete spacers 32 along sidewalls of masking features 16 and 24.

Referring to FIG. 8, masking features 16 and 24 (FIG. 7) are removed selectively relative to spacers 32. In embodiments in which the masking features comprise photoresist and the spacers comprise silicon dioxide, such removal may utilize oxidation of the photoresist.

The spacers 32 of FIG. 8 form a repeating pattern across material 14. Specifically, each of the spacers has a width of about x, and the spacers are separated from one another by gaps 34 that also have widths of about x. The spacers 32 thus form a repeating pattern having a pitch of about 2x, or in other words a pitch that is about one-fourth of the initial pitch of the first set of masking features 16 at the processing stage of FIG. 2. The pattern of spacers 32 may be utilized to form $4F^2$ layouts.

Referring to FIG. 9, the pattern of spacers 32 is transferred into underlying material 14 with one or more suitable etches. As discussed above, base 12 and material 14 may be together considered a semiconductor substrate in some embodiments. Thus, the transfer of the patterned into underlying material 14 may be considered to be transferring of the patterned into a semiconductor substrate in some embodiments. Although the pattern of the spacers is shown transferred only into material 14, in other embodiments the pattern may be transferred through material 14 and into underlying base 12 with one or more suitable etches.

In some embodiments, material 14 may be representative of one or more materials utilized for fabrication of memory architecture (e.g., NAND, DRAM and/or cross-point memory). In such embodiments, the transfer of the pattern from spacers 32 into material 14 may represent patterning of one or more materials into structures of memory architecture. For instance, patterning of material 14 may represent patterning of one or more gate materials of NAND unit cells; may represent patterning of a plurality of lines of cross-point memory cells; and/or may represent patterning of wordlines and/or bitlines of DRAM.

The embodiment of FIGS. 1-9 comprises lithographically forming the first and second masking features, and then laterally trimming the first and second masking features in a common process step prior to forming spacer material. In other embodiments, the first masking features may be formed and laterally trimmed prior to forming the second masking features. The second masking features may than be laterally trimmed in a separate process step from that utilized for laterally trimming the first masking features. FIGS. 10-17 illustrate an example process in which the first and second masking features are laterally trimmed in separate processing stages relative to one another. Similar numbering will be used to describe FIGS. 10-17 as is utilized above to describe FIGS. 1-9, where appropriate.

Referring to FIG. 10, such illustrates construction 10 at the same processing stage as was discussed above with reference to FIG. 2. Accordingly, the first masking features 16 are shown after they have been lithographically formed over material 14. The first masking features may comprise photoresist, and may be formed by photolithographic processing. The first masking features correspond to a first set of masking features extending across material 14. In embodiments in which the masking features are composed of photoresist, they may be referred to as photoresist features. Each of the individual masking features 16 comprises the width of about 3x (which may be from about 3x to about 4x in some embodiments), and the masking features 16 are spaced from one another by first gaps 18 having widths of about 5x (which may be from about 4x to about 5x in some embodiments). The masking features 16 form a repeating pattern across material 14, with such repeating pattern having the pitch of about 8x. Thus, the masking features 16 have a width that is about three-eighths of the pitch in the shown embodiment.

Referring to FIG. 11, photoresist features 16 are laterally trimmed to reduce the widths of the photoresist features by about two-thirds. Accordingly, the remaining photoresist features 16 have widths of about x. The reduction of the widths of the photoresist features increases the widths of gaps 18 to about 7x. The photoresist features 16 and gaps 18 together form a repeating pattern that remains on the pitch 8x of the repeating pattern of FIG. 10, but that now has photoresist features 16 consuming about one-eighth of the pitch rather than the three-eighths of the pitch that had been consumed by the features 16 at the processing stage of FIG. 10.

The lateral trimming may be accomplished by any suitable process. In some embodiments the masking features consist of photoresist, and the lateral trimming utilizes an $O_2$-based plasma with one or more passivation additives (e.g., $CH_2F_2$).

Referring to FIG. 12, masking features 16 are treated to render the trimmed features resistant to solvent casting of the material used for a second masking pattern (the second masking pattern is shown in FIG. 13), and to render the features resistant to lateral trimming that is to be utilized in subsequent processing (specifically, the processing described below with reference to FIG. 14).

The treatment of masking features 16 may be any suitable treatment which renders the masking features resistant to subsequent solvent casting and lateral trimming. In the shown embodiment, a thin layer of protective material 50 is formed along all exposed surfaces of masking features 16. Protective material 50 may be an oxide, and in some embodiments may comprise, consist essentially of, or consist of silicon dioxide. The protective material 50 may be formed to be thin enough so that the combined width of the protective material and the masking features 16 is still about x; and in some embodiments the thickness of protective material 50 may be less than about 50 angstroms, such as, for example, from about 10 angstroms to about 30 angstroms.

Protective material 50 may be formed by any suitable processing, and in some embodiments may be formed by ALD.

Another method for treating masking features 16 to render them resistant to subsequent solvent casting and lateral trimming is thermal treatment of the masking features to induce a chemical change throughout the masking features. For instance, the masking features 16 may be formed to comprise a cross-linking agent, and the treatment of the masking features may comprise heating the masking features to a temperature which induces cross-linking throughout the masking features.

Yet another method for treating masking features 16 to render them resistant to subsequent solvent casting and lateral trimming is chemical treatment of outer surfaces of the masking features to induce a chemical change along the exposed outer surfaces of the masking features. The chemical treatment may comprise exposure to halogen (for instance, fluorine) in a plasma to render the exposed surfaces resistant to subsequent solvent casting and lateral trimming.

The various methods for rendering the masking features resistant to subsequent lateral trimming and/or solvent casting may referred to as "freezing" of the masking features, in that the methods substantially freeze the features in a particular configuration while the features are exposed to subsequent solvent casting and/or lateral trimming conditions.

Referring to FIG. 13, the second masking features 24 are formed over material 14. The second masking features may correspond to photolithographically-formed photoresist features, and alternate with the first masking features 16. In the shown embodiment, the second masking features 24 are formed over protective material 50. In other embodiments in which the treatment of the first masking features of FIG. 12 includes a "freezing" treatment but does not comprise utilization of a protective material, the second masking features 24 may be formed directly against material 14.

The second masking features 24 have the width 3x (which may be a width of from about 3x to about 4x in some embodiments), and are formed at the pitch 8x. The second masking features 24 are formed within the gaps 18 (FIG. 12) and are centrally located within such gaps. Accordingly, the second masking features 24 are spaced from the first masking features 16 by intervening gaps 52 having widths of about 2x (which may be a width of from about x to about 2x in some embodiments).

Referring to FIG. 14, the second masking features 24 are laterally trimmed to reduce the lateral widths of the second masking features by about two-thirds. The remaining masking features 24 thus have lateral widths of about x. The first masking features 16 are not substantially altered during the reduction of the lateral widths of the second masking features 24, due to the first masking features 16 being protected by the treatment discussed above with reference to FIG. 12, (with such treatment being formation of protective layer 50 in the shown embodiment).

The lateral trimming of the second masking features 24 extends the widths of gaps 52 to now be about 3x.

The trimmed second masking features 24 and trimmed first masking features 16 together form a repeating pattern across material 14. Such repeating pattern comprises the masking features 24 and 16 having widths of about x, and comprises the gaps 52 having the widths of about 3x. Such repeating pattern has a pitch of about 4x. In describing the repeating pattern of the first and second masking features, protective material 50 may or may not be considered in the overall line widths. This is because protective material 50 may be formed to be thin enough so that it does not significantly impact the repeating pattern that corresponds to masking features 24 and 16.

Referring to FIG. 15, spacer material 30 is formed over and between the masking features 16 and 24. Spacer material 30 is formed to the thickness of about x, and accordingly the spacer material partially fills the intervening spaces 52. Specifically, the spacer material 30 forms a layer of about thickness x along exposed surfaces of masking features 16 and 24, and leaves a gap of about width x within the intervening spaces 52.

In some embodiments the spacer material may comprise, consist essentially of, or consist of an oxide, such as, for example, silicon dioxide.

Referring to FIG. 16, the spacer material 30 is anisotropically etched to form a plurality of discrete spacers 32 along sidewalls of masking features 16 and 24. The spacers 32 are directly against sidewalls of second masking features 24, and spaced from sidewalls of masking features 16 by protective material 50 in the shown embodiment. In embodiments in which the masking features 16 are treated for resistance to trimming by a method which does not involve formation of protective material 50 (with such treatments being discussed above with reference to FIG. 12), the spacers 32 may be directly against the masking features 16. The spacers 32 have thicknesses of about x.

Referring to FIG. 17, masking features 16 and 24 (FIG. 16) are removed selectively relative to spacers 32. In embodiments in which the masking features comprise photoresist and the spacers comprise silicon dioxide, such removal may utilize oxidation of the photoresist. In the shown embodiment, a thin amount of protective material 50 is removed from over masking features 16 (FIG. 16) to expose the features so that they may be subsequently removed with the etch selective relative to spacers 32. The removal of the thin amount of protective material 50 may comprise brief exposure to an oxide etchant in embodiments in which protective material 50 comprises silicon dioxide.

The spacers 32 of FIG. 17 form a repeating pattern across material 14. Specifically, each of the spacers has a width of about x, and the spacers are separated from one another by gaps 34 that also have widths of about x. The spacers 32 thus form a repeating pattern having a pitch of about 2x, or in other words a pitch that is about one-fourth of the initial pitch of the first set of masking features 16 at the processing stage of FIG. 10.

The repeating pattern of spacers in FIG. 17 is similar to that discussed above with reference to FIG. 8. However, in the embodiment shown in FIG. 17, the spacers 32 are over protective material 50, and the spacers that had been formed adjacent first masking features 16 (FIG. 16) also have protective material 50 along their sidewalls. Material 50 may be formed to be thin enough so that it does not substantially alter the repeating pattern formed by the spacers so that the pattern of FIG. 17 may be used identically to that of FIG. 8. In other embodiments, material 50 may be omitted and first masking features 16 treated by other methods to render the masking features 16 resistant to lateral trimming (such other methods are discussed above with reference to FIG. 12). In such other embodiments, the construction of FIG. 17 may be identical to that of FIG. 8.

The construction of FIG. 17 may be submitted to subsequent processing analogous to that of FIG. 9 to extend the pattern of the spacers into the substrate underlying such spacers. Such patterning to be utilized to form anything in which a repeating pattern is desired, and in some embodiments may be utilized to form memory architecture, such as, for example, NAND architecture, DRAM architecture, and/or cross-point memory architecture.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a pattern, comprising:
   photolithographically forming a first set of photoresist features over the substrate;
   after photolithographically forming the first set of photoresist features, photolithographically forming a second set of photoresist features; at least some of the features of said second set alternating with photoresist features of the first set along at least one cross-section extending through photoresist features of the first and second sets;
   forming spacer material over and between the photoresist features of the first and second sets;
   anisotropically etching the spacer material to form spacers along the photoresist features of the first and second sets; and
   removing the photoresist features of the first and second sets to leave a pattern of the spacers over the substrate.

2. The method of claim 1 further comprising laterally trimming photoresist of the first set of photoresist features to narrow the photoresist features of the first set prior to forming the second set of photoresist features.

3. The method of claim 2 wherein the lateral trimming photoresist of the first set of photoresist features narrows the photoresist features of the first set by from about two-thirds to about three-quarters.

4. The method of claim 2 further comprising laterally trimming photoresist of the second set of photoresist features to narrow the photoresist features of the second set prior to forming the spacer material.

5. The method of claim 4 wherein the lateral trimming photoresist of the second set of photoresist features narrows the photoresist features of the second set by from about two-thirds to about three-quarters.

6. The method of claim 2 further comprising:
   treating the narrowed photoresist features of the first set to render such narrowed photoresist features resistant to subsequent trimming;
   after said treating, laterally trimming the second set of photoresist features to narrow said photoresist features prior to forming the spacer material.

7. The method of claim 6 wherein the treating comprises thermal treatment of the narrowed photoresist features of the first set to chemically alter at least exposed surfaces of the narrowed photoresist features of the first set.

8. The method of claim 6 wherein the treating comprises atomic layer deposition of a silicon-dioxide-containing material along exposed surfaces of the narrowed photoresist features of the first set.

9. The method of claim 1 further comprising laterally trimming photoresist of the first and second sets of photoresist features in a common process step prior to forming the spacer material.

10. A method of forming a pattern, comprising:
photolithographically forming a first set of photoresist features over the substrate; the first set of photoresist features being spaced from one another by first gaps; the photoresist features of the first set being at a first pitch, with said first pitch being a distance across a first photoresist feature and a first gap;
after photolithographically forming the first set of photoresist features, photolithographically forming a second set of photoresist features; at least some of the features of said second set being within the first gaps so that photoresist features of the second set alternate with photoresist features of the first set along at least one cross-section extending through photoresist features of the first and second sets; the second set of photoresist features being spaced from one another by second gaps; the photoresist features of the second set being at a second pitch, with said second pitch being a distance across a second photoresist feature and a second gap; the second pitch being about the same as the first pitch;
forming spacer material over and between the photoresist features of the first and second sets;
anisotropically etching the spacer material to form spacers along the photoresist features of the first and second sets; and
removing the photoresist features of the first and second sets to leave a pattern of the spacers over the substrate.

11. The method of claim 10 wherein photoresist features of the first set of photoresist features comprise about three-eighths of the first pitch.

12. The method of claim 10 further comprising laterally trimming photoresist of the first and second sets of photoresist features prior to forming the spacer material.

13. The method of claim 12 wherein the laterally trimming of the photoresist of the first and second sets of photoresist features occurs in a single process step.

14. The method of claim 12 wherein the laterally trimming of the photoresist of the first set of photoresist features occurs in a separate process step from the lateral trimming of the photoresist of the second set of photoresist features.

15. A method of forming a pattern, comprising:
photolithographically forming a first set of photoresist features over the substrate; individual features of the first set of photoresist features having widths of from about 3x to about 4x and being spaced from one another by first gaps; the first gaps having widths of from about 4x to about 5x;
laterally trimming the individual features of the first set of photoresist features to form trimmed first photoresist features; the trimmed first photoresist features having widths of about x; the trimming of the first photoresist features extending the widths of the first gaps to about 7x;
treating the trimmed first photoresist features to render the trimmed first photoresist features resistant to subsequent lateral trimming and/or solvent casting;
after treating the trimmed first photoresist features, photolithographically forming a second set of photoresist features over the substrate, at least some of the features of said second set being within the extended first gaps so that photoresist features of the second set alternate with photoresist features of the first set along at least one cross-section extending through photoresist features of the first and second sets; individual features of the second set of photoresist features having widths of from about 3x to about 4x and being spaced from the trimmed first photoresist features by intervening gaps having widths of from about x to about 2x;
laterally trimming the individual features of the second set of photoresist features to form trimmed second photoresist features; the trimmed second photoresist features having widths of about x; the trimming of the second photoresist features extending the widths of the intervening gaps to from about 3x to about 4x;
forming spacer material over and between the trimmed first and second photoresist features;
anisotropically etching the spacer material to form spacers along the trimmed first and second photoresist features, the spacers having widths of about x;
removing the trimmed first and second photoresist features to leave a pattern of the spacers over the substrate, the pattern comprising spacers of width x spaced from one another by distances of width x; and
wherein x is a dimension, and is the same dimension for all recited aspects of this claim.

16. The method of claim 15 wherein the treating of the trimmed first photoresist features comprises forming a protective material along surfaces the trimmed first photoresist features.

17. The method of claim 16 wherein the forming of the protective material comprises atomic layer deposition.

18. The method of claim 16 wherein the protective material extends along the substrate within the first gaps, and wherein the photoresist features of the second set are formed over the protective material.

19. The method of claim 15 wherein the treating of the trimmed first photoresist features comprises thermal treatment of the trimmed first photoresist features to induce a chemical change throughout the trimmed first photoresist features.

20. The method of claim 15 wherein the treating of the trimmed first photoresist features comprises chemical treatment of outer surfaces of the trimmed first photoresist features to induce a chemical change along the outer surfaces of the trimmed first photoresist features.

21. The method of claim 15 wherein the substrate is a semiconductor substrate, and wherein the spacers consist of silicon dioxide.

22. A method of forming a pattern, comprising:
photolithographically forming a first set of photoresist features over the substrate;
individual features of the first set of photoresist features having widths of about 3x and being spaced from one another by first gaps; the first gaps having widths of about 5x;
after photolithographically forming the first set of photoresist features; photolithographically forming a second set of photoresist features over the substrate; at least some of the features of said second set being within the first gaps so that photoresist features of the second set alternate with photoresist features of the first set along at least one cross-section extending through photoresist features of the first and second sets; individual features of the second set of photoresist features having widths of about 3x and being spaced from the first photoresist features by intervening gaps having widths of about x;

laterally trimming the individual features of the first and second sets of photoresist features to form trimmed first and second photoresist features; the trimmed first and second photoresist features having widths of about x; the trimming of the first and second photoresist features extending the widths of the intervening gaps to about 3x;

forming spacer material over and between the trimmed first and second photoresist features;

anisotropically etching the spacer material to form spacers along the trimmed first and second photoresist features, the spacers having widths of about x;

removing the trimmed first and second photoresist features to leave a pattern of the spacers over the substrate, the pattern comprising spacers of width x spaced from one another by distances of width x; and wherein x is a dimension, and is the same dimension for all recited aspects of this claim.

23. The method of claim 22 further comprising transferring the pattern of the spacers into the substrate with one or more etches.

24. The method of claim 23 wherein the substrate is a semiconductor substrate comprising one or more materials utilized for fabrication of memory architecture, and wherein the transferring the pattern into the substrate patterns said one or more materials into structures of memory architecture.

25. The method of claim 24 wherein the memory architecture is NAND.

26. The method of claim 24 wherein the memory architecture is DRAM.

27. The method of claim 24 wherein the memory architecture comprises cross-point memory cells.

28. The method of claim 23 wherein the spacers consist of silicon dioxide.

* * * * *